(12) United States Patent
Morley et al.

(10) Patent No.: US 6,549,446 B2
(45) Date of Patent: Apr. 15, 2003

(54) DATA BALANCING SCHEME IN SOLID STATE STORAGE DEVICES

(75) Inventors: Stephen Morley, Bristol (GB); Kevin Lloyd-Jones, Bristol (GB); Dominic P. McCarthy, Mountain View, CA (US); Peter Joseph Bramhall, Bristol (GB)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/959,591

(22) PCT Filed: Feb. 19, 2001

(86) PCT No.: PCT/GB01/00656

§ 371 (c)(1),
(2), (4) Date: Jan. 25, 2002

(87) PCT Pub. No.: WO01/65562

PCT Pub. Date: Sep. 7, 2001

(65) Prior Publication Data

US 2002/0159285 A1 Oct. 31, 2002

(30) Foreign Application Priority Data

Mar. 1, 2000 (EP) .............................................. 00301674

(51) Int. Cl.$^7$ ................................................. G11C 17/02
(52) U.S. Cl. ..................................... 365/97; 365/225.5
(58) Field of Search ................................ 365/97, 225.5

(56) References Cited

U.S. PATENT DOCUMENTS

| | | | |
|---|---|---|---|
| 5,519,603 A | * 5/1996 | Allbery, Jr. et al. | ......... 364/133 |
| 5,561,770 A | * 10/1996 | de Bruijn et al. | ....... 395/200.06 |
| 5,727,226 A | 3/1998 | Alexander et al. | .......... 395/800 |

FOREIGN PATENT DOCUMENTS

EP          0 917 154          5/1999

* cited by examiner

Primary Examiner—M. Tran

(57) ABSTRACT

A data storage device comprises at least one array of memory elements arranged in a plurality of rows and columns; coding means for coding an input data into a form having a balanced proportion of '1's and '0's, said coding means comprising means for applying an output of a pseudo random bit sequence generator to said incoming data, wherein the coded data is stored in the array of memory elements such that the '1's and '0's are spatially distributed relatively evenly across the plurality of memory elements; and decoding means for decoding the coded data read from the plurality of memory elements, into the original data.

18 Claims, 5 Drawing Sheets

| | | | | | | | | |
|---|---|---|---|---|---|---|---|---|
| Row 7 | 0000 | 0000 | 1011 | 1100 | 0000 | 0011 | 1000 | 1000 |
| Row 6 | 0000 | 0000 | 0101 | 1110 | 0000 | 0001 | 1100 | 0100 |
| Row 5 | 1000 | 0000 | 0010 | 1111 | 0000 | 0000 | 1110 | 0010 |
| Row 4 | 0100 | 0000 | 0001 | 0111 | 1000 | 0000 | 0111 | 0001 |
| Row 3 | 1010 | 0000 | 0000 | 1011 | 1100 | 0000 | 0011 | 1000 |
| Row 2 | 0101 | 0000 | 0000 | 0101 | 1110 | 0000 | 0001 | 1100 |
| Row 1 | 0010 | 1000 | 0000 | 0010 | 1111 | 0000 | 0000 | 1110 |
| Row 0 | 1001 | 0100 | 0000 | 0001 | 0111 | 1000 | 0000 | 0111 |
| Bit No | 0 | 4 | 8 | | | | | ...28 |

| | | | | | | | |
|---|---|---|---|---|---|---|---|
| Row 7 | 0000 | 0000 | 1011 | 1100 | 0000 | 0011 | 0000 | 1000 |
| Row 6 | 0000 | 0000 | 0101 | 1110 | 0000 | 0001 | 1000 | 0100 |
| Row 5 | 1000 | 0000 | 0010 | 1111 | 0000 | 0000 | 1110 | 0010 |
| Row 4 | 0100 | 0000 | 0001 | 0111 | 1000 | 0000 | 0111 | 0001 |
| Row 3 | 1010 | 0000 | 0000 | 1011 | 1100 | 0000 | 0011 | 1000 |
| Row 2 | 0101 | 0000 | 0000 | 0101 | 1110 | 0000 | 0001 | 1100 |
| Row 1 | 0010 | 1000 | 0000 | 0010 | 1111 | 0000 | 0000 | 1110 |
| Row 0 | 1001 | 0100 | 0000 | 0001 | 0111 | 1000 | 0000 | 0111 |
| Bit No | 0 | 4 | 8 | | | | | 28 |

Fig. 5

DATA BALANCING SCHEME IN SOLID STATE STORAGE DEVICES

FIELD OF THE INVENTION

The present invention relates to solid state data storage devices, and particularly although not exclusively, to solid state storage devices having one or more two-dimensional arrays of memory elements.

BACKGROUND TO THE INVENTION

The invention relates to solid state memory devices such as existing semi conductor technologies, for example dynamic random access memory (DRAM), FLASH and static random access memory (SRAM) or other technologies, for example magnetic random access memory (MRAM). In these devices, memory cells are arranged in one or more two-dimensional arrays addressed by word lines (rows) and bit lines (columns). To read and write cells in the arrays, one row and one or more bit lines are 'selected' to access the required cells. Depending upon the implementation, there may be one read/write circuit per column (enabling all bits on the row to be read/written simultaneously) or read/write circuits may be multiplexed or shared between columns.

In DRAM, the memory cell uses a capacitor. A charge held on this capacitor determines the state of the cell (1 or 0). In FLASH memories, the state of a cell is determined by a charge trapped in a floating node within the memory cell. In MRAM, the state of a cell is determined by the electrical resistance resulting from the orientation of a magnetic field within the cell.

SUMMARY OF THE INVENTION

In arrays of memory cells as described above, the operation and performance of individual cells can be influenced by the data held in other cells along selected word and bit lines. The data in the cells on a particular word or bit line can change the electrical characteristics (such as resistance, capacitance) of that word or bit line and therefore compromise the performance of the read and write circuits. Extremes of this effect may be encountered when the memory cells are all at a '1' state or all at a '0' state along a word or bit line. This typically occurs, for example, following reset conditions when an entire memory array may be initialized to a fixed value. This effect is particularly pronounced in MRAM arrays such as those described in the applicants patent application EP 0918334 titled 'Solid state memory with magnetic storage cells', as DC currents flow through the array of memory cells when reading and writing. Specific problems include:

A high number of ones or zeros introduces a DC bias into a word or bit line. The read and write circuits have to cope with this bias, adding complexity to the read and write circuits.

Write and read signals will be skewed by the bias, that is to say by the different electrical loads presented by the word or bit line as the density of ones and zeros changes along the word or bit line. This will affect the read/write error rate performance of these circuits.

Parasitic or leakage paths through unselected cells on the word and bit line(s) which are being accessed will also change. Minimizing these leakage paths is critical to operation of MRAM arrays such as those described in European patent application EP 0918334 entitled 'Solid state memory with magnetic storage cells'.

Pattern dependent faults may occur due to concentration of ones and zeros in areas of the array.

Similar problems are experienced in conventional DRAM and SRAM devices, but to a lesser degree than in MRAM devices.

The invention provides a method for storing data in an array such that the above problems are minimized. Specific implementations of the invention aim to balance the number of 0's and 1's in any word or bit line in an array. When applied to an array of memory elements, the term balanced means that within an individual word or bit line in the array, an equal number of 1's occur as do 0's. The term substantially balanced is construed accordingly, as a case where a substantially similar number of 1's occur as do 0's.

Data in the array is coded so as to substantially balance the number of 1's and 0's on each word or bit line. This coding also avoids long contiguous runs of 1's and 0's on each word or bit line.

By storing data in a two-dimensional array in a balanced manner, the problem of large variations in word and bit line characteristics is avoided. DC bias on word and bit lines is minimized and thus the data affecting electrical characteristics of word and bit lines are minimized. This has benefits in improved performance and reliability of the array, and a lower error rate when reading the array. The design and complexity of the read/write circuits is also reduced, since such a wide variation of DC conditions does not need to be accommodated and peak write currents in the array are reduced.

Additionally, an effect of the data affecting electrical characteristics of a plurality of word lines and bit lines is minimized for each word line and bit line.

Specific implementations and methods according to the present invention may overcome a problem of word and bit line characteristic variations, without the need for adding additional complexity to read-write drive circuitry to overcome the electrical characteristic variations.

Specific implementations according to the present invention may avoid degradation of read-write performance due to electrical loading of bit lines and word lines by extended data sequences of all '1's or all '0's stored in individual memory elements along a word line or bit line.

According to a first aspect of the present invention there is provided a method of writing incoming data to a data storage device comprising an array of memory elements arranged in rows and columns and accessible by a plurality of data access lines said method comprising the steps of:

receiving said incoming data as a plurality of ones and zeros;

coding said incoming data to produce a coded data, said coded data comprising a plurality of ones and zeros and said coding comprising applying an output of a pseudo random bit sequence generator to said incoming data;

storing said coded data in said array of memory elements, such that a plurality of said ones and zeros comprising said coded data are stored along each row, and a plurality of ones and zeros comprising said coded data are stored along each column, such that:

a substantially similar number of ones and zeros occur along each said row of memory elements; and a substantially similar number of ones and zeros occur along each said column of memory elements.

By the term "substantially similar" it is meant that a number of ones and zeros stored along each row or column are equalized in said coded data, as compared with the equivalent situation of storing said incoming data along the same rows or columns. A disparity between the number of ones and the number of zeros in any block of said coded stored data may be less than in an equivalent block of said incoming data. Ideally, an equal number of ones as zeros will occur along each said row of memory elements, and an equal number of ones and zeros will occur along each said column of memory elements.

Preferably, for each said row a distribution of said ones and zeros of said row is such that significant spatial concentrations of ones and significant spatial concentrations of zeros are avoided.

Preferably, for each said column, a distribution of said ones and zeros of said column is such that significant spatial concentrations of ones and significant spatial concentrations of zeros are avoided along said column.

Preferably said incoming data is combined with a predetermined code value, such that said combination of said incoming data and said coding produces said coded data having a relatively more even distribution of ones and zeros in said coded data than in said incoming data.

Preferably said step of coding said incoming data comprises coding said incoming data to produce a pseudo-randomized coded data. An output of a pseudo random bit sequence generator may be applied to said incoming data.

According to a second aspect of the present invention there is provided a method of reading coded data from a data storage device comprising an array of memory elements arranged in a plurality of rows and columns, and accessed by a plurality of data access lines, wherein values of data stored on said memory elements affect electrical characteristics of said data storage device, said coded data comprising a plurality of ones and zeros and said coded data having been produced by applying an output of a pseudo random bit sequence generator to the pre-coded data, said method comprising the steps of:

reading a said coded data from said memory array;

inputting said coded data into a decoding means;

decoding said read coded data to produce a decoded data having a distribution of ones and zeros having a greater disparity between a number of ones and zeros than said coded data read from said two-dimensional array of memory elements.

The decoded data may have a greater uninterrupted sequence of bits of a same type than said coded data, over an equivalent block of data in the coded and decoded data.

Preferably said step of decoding comprises combining said coded data with a predetermined code value, to obtain said decoded data.

Preferably said step of decoding said coded data comprises de-randomizing said coded data to produce decoded data. The output of a pseudo-random bit sequence generator may be applied to said coded data.

The invention includes a data storage device comprising:

at least one array of memory elements arranged in a plurality of rows and columns, said memory elements accessed by a plurality of data access lines.

coding means for coding an input data into a form having a balanced proportion of ones and zeros, said coding means comprising means for applying an output of a pseudo random bit sequence generator to said incoming data;

wherein said coded data is stored in said array of memory elements such that said ones and zeros are spatially distributed across said plurality of memory elements in a manner which substantially balances a number of said ones and zeros along each of said rows and columns; and decoding means for decoding said coded data read from said plurality of memory elements, into said original data.

According to a third aspect of the present invention, there is provided a method of writing incoming data to a magnetic random access data storage device comprising an array of memory elements arranged in rows and columns and accessible by a plurality of data access lines said method comprising the steps of:

receiving said incoming data as a plurality of ones and zeros;

coding said incoming data to produce a coded data, said coded data comprising a plurality of ones and zeros;

storing said coded data in said array of memory elements, such that a plurality of said ones and zeros comprising said coded data are stored along each row, and a plurality of ones and zeros comprising said coded data are stored along each column, such that:

a substantially similar number of ones and zeros occur along each said row of memory elements; and a substantially similar number of ones and zeros occur along each said column of memory elements.

According to a fourth aspect of the present invention, there is provided a method of reading coded data from a magnetic random access data storage device comprising an array of memory elements arranged in a plurality of rows and columns, and accessed by a plurality of data access lines, wherein values of data stored on said memory elements affect electrical characteristics of said data storage device, said coded data comprising a plurality of ones and zeros, said method comprising the steps of:

reading a said coded data from said memory array;

inputting said coded data into a decoding means;

decoding said read coded data to produce a decoded data having a distribution of ones and zeros having a greater disparity between a number of ones and zeros than said coded data read from said two-dimensional array of memory elements.

According to a fifth aspect of the present invention, there is provided a magnetic random access memory data storage device comprising:

at least one array of memory elements arranged in a plurality of rows and columns, said memory elements accessed by a plurality of data access lines.

coding means for coding an input data into a form having a balanced proportion of ones and zeros;

wherein said coded data is stored in said array of memory elements such that said ones and zeros are spatially distributed across said plurality of memory elements in a manner which substantially balances a number of said ones and zeros along each of said rows and columns; and decoding means for decoding said coded data read from said plurality of memory elements, into said original data.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which:

FIG. 5 illustrates schematically an output of a data balancing circuit stored in a two-dimensional array of memory elements according to a specific implementation of the present invention.

DETAILED DESCRIPTION OF THE BEST MODE FOR CARRYING OUT THE INVENTION

There will now be described by way of example the best mode contemplated by the inventors for carrying out the invention. In the following description numerous specific details are set forth in order to provide a thorough understanding of the present invention. It will be apparent however, to one skilled in the art, that the present invention may be practiced without limitation to these specific details. In other instances, well known methods and structures have not been described in detail so as not to unnecessarily obscure the present invention.

Figure 1:
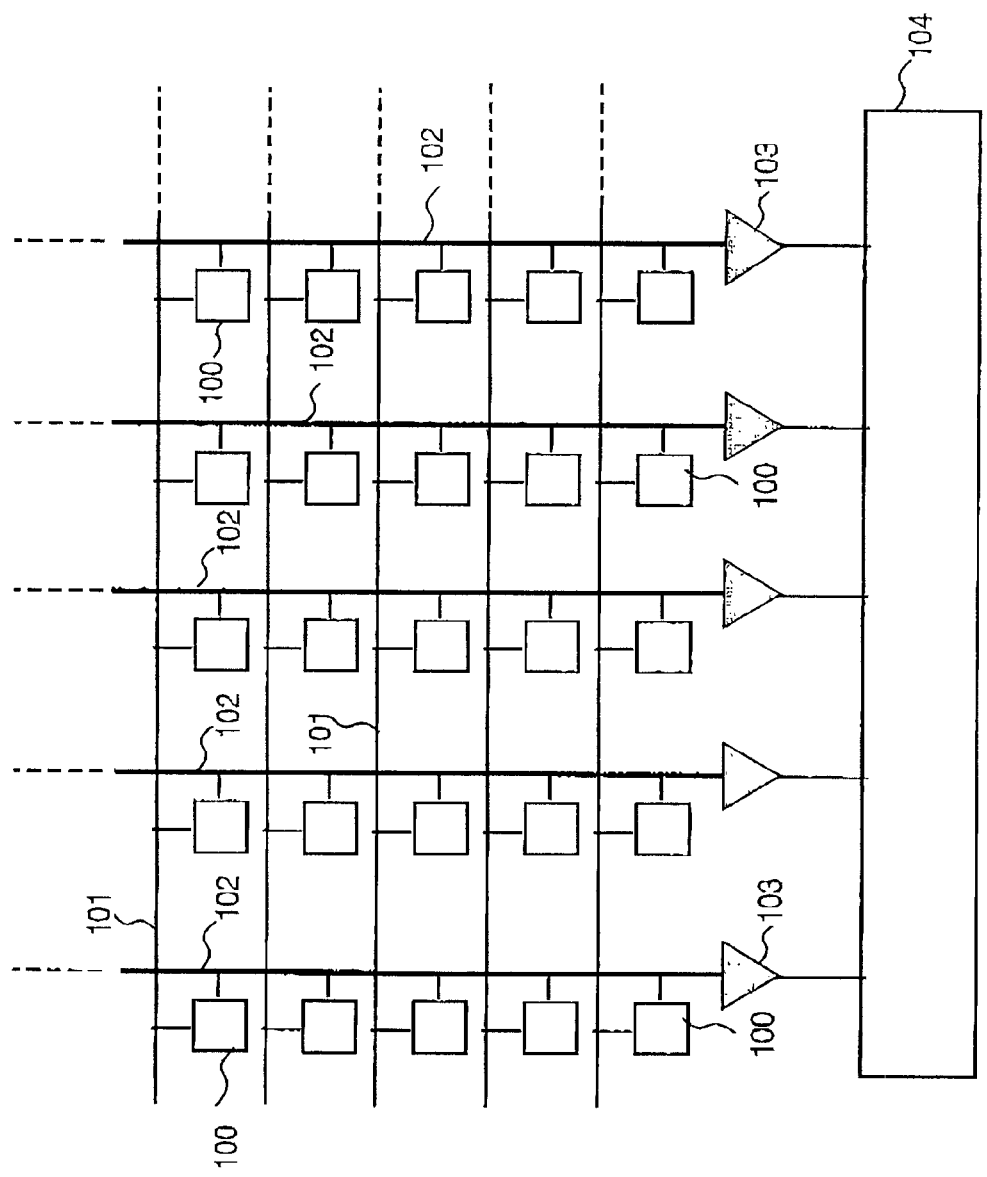
FIG. 1 herein shows schematically circuit elements of a section of a two-dimensional array of a solid state memory storage device comprising a plurality of individual memory elements arranged in rows and columns, and having a plurality of word lines and bit lines, and a plurality of sense amplifiers, for reading data from the array.

Referring to FIG. 1 herein, there is illustrated schematically a small area of a two-dimensional array of memory elements of a magnetic random access memory (MRAM). A plurality of memory elements 100 are arranged in a two-dimensional array in a plurality of rows and a plurality of columns. Along each row extends a corresponding respective word line 101 and along each column extends a corresponding respective bit line 102, each memory element being placed at a corresponding respective intersection between a said word line and a said bit line. A plurality of sense amplifiers 103 are connected to the bit lines 102 for reading data bits from addressed memory elements 100 into a data store 104.

In order to perform a read operation to a particular memory element or plurality of memory elements along a row, the row is selected by placing a read enable signal on the corresponding word line. Data is read from the one or plurality of memory elements along the row into the data store 104. In the implementation of FIG. 1, a selected row is connected to ground whilst all unselected rows and all columns are connected to a positive read voltage. A current flows along the selected columns, through the selected bits and along the selected rows. The current is detected by the sense amplifiers.

Figure 2:
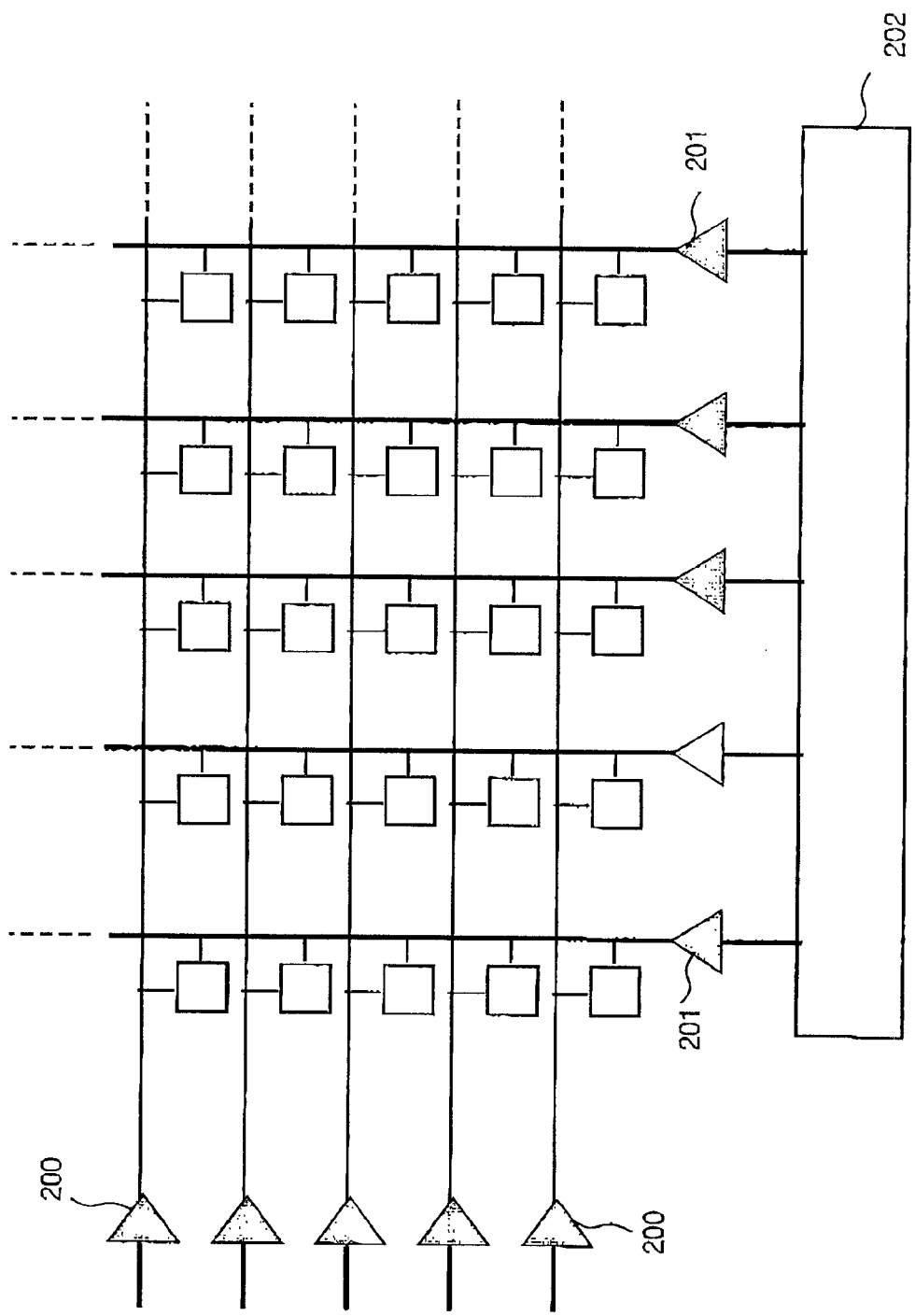
FIG. 2 illustrates schematically circuit elements of the memory array of FIG. 1, having a plurality of write amplifiers for writing data to the array of memory elements.

Referring to FIG. 2 herein, similarly, to perform a write operation, either to a whole row of memory elements or to a single memory element in a row, depending upon the specific implementation of the device, a write signal is applied to the corresponding word line and bit line(s) by the corresponding amplifiers 200, 201. In the implementation described, by connecting one end of each selected row and column to ground, and the other to a write voltage, a current is made to flow along all selected rows and columns. The cumulative field produced by the two currents in the memory cells at the intersections of selected rows and columns sets the orientation of the magnetic field in the cell, and therefore defines the cells' state. The column current can be switched to give a '1' or a '0'.

Figure 3:
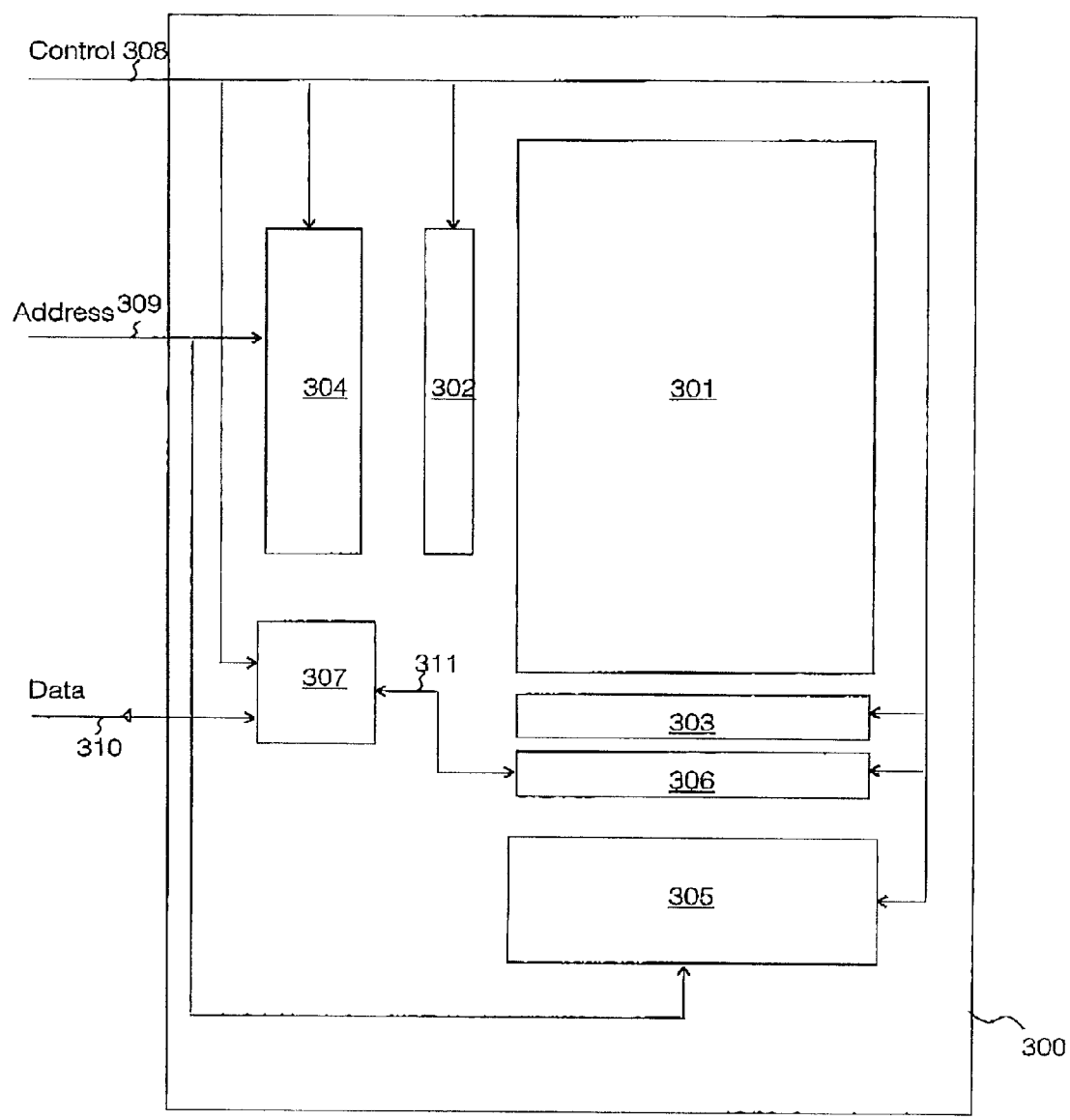
FIG. 3 illustrates schematically an architecture of a solid state storage device incorporating means for balancing distribution of written data over a two-dimensional array of memory elements.

Referring to FIG. 3 herein, there is illustrated schematically a magnetic random access memory device 300 comprising a two-dimensional array 301 of magnetic memory elements, the elements arranged in a plurality of rows and columns, having a plurality of word lines extending along the rows and a plurality of bit lines extending along the columns as illustrated schematically with reference to FIGS. 1 and 2 herein; a row read-write circuit 302 comprising a first plurality of write amplifiers; a column read-write circuit 303, comprising a plurality of sense amplifiers and a second plurality of write amplifiers; a row address circuit 304 for addressing individual rows of memory elements in the array; a column address circuit 305 for addressing columns of the array of memory elements; a data store 306 for storing data prior to writing the data to the two-dimensional array of memory elements, and for storing data read from the array; a data balancing circuit 307 for encoding an order of bits of data to be written to the array and read from the array, such that data within each row or column is substantially balanced and has a substantially equal number of '1's and '0's within the row or column, and extended sequences of '1's or '0's within each row or column are avoided; control signals 308 for example write pulses for controlling the row read-write circuit, column read-write circuit, row addressing circuit, column addressing circuit, data store circuit and balancing circuit: an address bus 309 for addressing memory elements via the row address circuit 304 and column address circuit 305; a data bus 310 for input and output of data from the array of memory elements; and an encoded data bus 311 which may form part of the data store 306 for transferring encoded data between the data balancing circuit and the array 301 of memory elements.

During a write operation to the memory device, the balancing circuit 307 receives data to be stored in the two-dimensional array of memory elements 301. As an example, take a stream of data received on the data bus 310 which is to be sequentially written to the memory array 301. This would typically occur after power-up to initialize the memory array to a known state. The data bit stream received can be any sequence of '1's or '0's. The data bit stream may include extended sequences comprising all '1's or all '0's, of arbitrary length. The data may be written along the rows of the two-dimensional array in the order in which it is received. Taking as an example a two-dimensional array of memory elements comprising 1024×1024 individual elements, giving a data storage capacity of 1,048,576 (1 Megabit) a received data bit stream may include a sequence of '1's of longer than 1024 bits length, which may be stored along an individual row of memory elements, such that all memory elements in the row store the bit '1'. Under these circumstances, the electrical characteristics of the associated word line of that particular row are affected by the presence of a magnetic state of each of the 1024 magnetic memory elements along the word line. Where all of the 1024 memory elements along the word line are in a same magnetic state, for example a '1', then the electrical characteristics of the word line are affected to a maximum extent due to the magnetic characteristics of the memory elements in the '1' state. On the other hand, where all 1024 memory elements of the row store the '0' state, the electrical characteristics of the word line are affected to a ID second extreme, by the magnetic characteristics of each of the memory elements in the '0' state. An extent of variation of the electrical characteristics of the word line is bounded on the one hand by the condition in which the memory elements all store the value '1', and on the other hand at a second extreme by the condition in which the memory areas all store '0's.

According to the specific implementation of the present invention described herein, the situation in which a row or a column of memory elements contains all '1's, or all '0's is sought to be avoided by substantially balancing the distribution of '1's and '0's in the data to be written across individual rows of memory elements and along individual columns of memory elements. Along each individual row of memory elements, extended sequences of purely '1's or purely '0's are sought to be avoided, and similarly along columns of memory elements, extended sequences of purely '1's or purely '0's are also sought to be avoided. Further, it is sought to achieve a balance of, as far as possible, substantially equal numbers of '1's and '0's stored in memory elements along each word line, and similarly, a balance of approximately an equal number of '1's or '0's stored in memory elements along each bit line. This is achieved by passing the incoming data bits through the balancing circuit 307 prior to writing it to the memory array as a write data.

During a write operation, data to be stored is received by balancing circuit 307 over data bus 309. The incoming data may comprise any sequence of '1's or '0's, including extended sequences of '1's and extended sequences of '0's. The data balancing circuit 307 operates firstly to convert the incoming data into a write data, in which the number of '1's and '0's are balanced with each other, and secondly, to distribute individual '1's and '0's, along the write data to avoid extended long sequences of solely '1's or solely '0's.

As will be appreciated by those skilled in the art, there are several implementation options open for design of the balancing circuit 307, using known coding schemes. On a read operation, a read data which is read into the data store 306 is passed through the data balancing circuit 307 and decoded into an output data which is output onto data bus 310.

In the best mode herein, the process of decoding the read bit data from the array is a direct reversal of the process of encoding the original bit incoming data is received from data bus 310.

Figure 4:
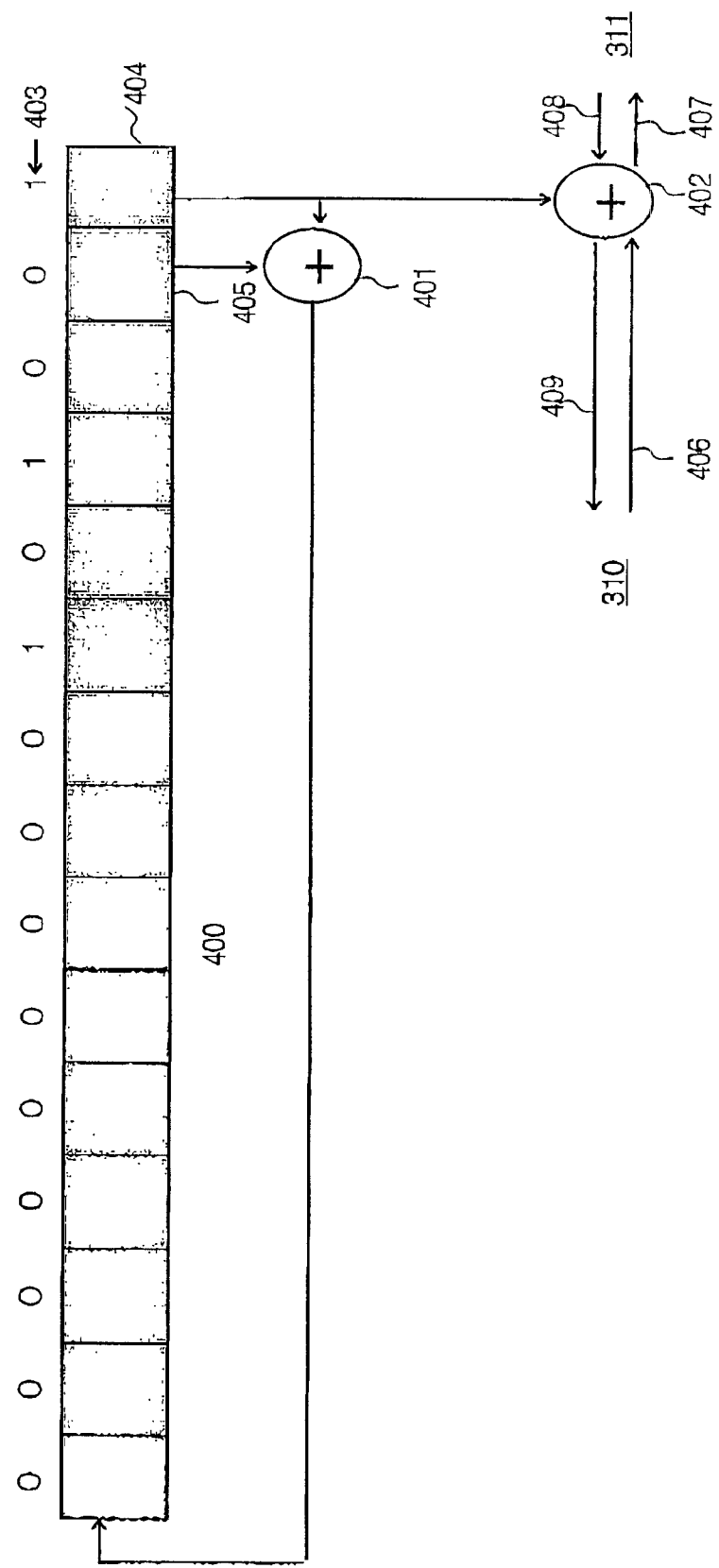
FIG. 4 illustrates schematically a logical structure of a data balancing circuit of the data storage device illustrated in FIG. 3.

Referring to FIG. 4 herein, there is illustrated schematically a logical layout of the balancing circuit 307. The balancing circuit randomizes the data to be written to the array by XORing the data with the output of a pseudo random bit sequence generator. The pseudo random bit sequence generator is implemented using a shift register and one or more XOR gates. In the best mode implementation, balancing circuit 307 comprises a shift register, which in a coding operation receives the incoming data bits from data bus 310 and codes the data into a format in which the distribution of '1's and '0's within the coded data is relatively balanced, avoiding extended sequences of '1's or '0's, and in a read operation, the shift register receives an encoded read data which is read from the memory array and decodes the encoded read data to recover the original data. The balancing circuit comprises a 15 bit shift register 400 having first and second exclusive OR (XOR) gates 401, 402 respectively. First XOR gate 401 performs an exclusive OR operation on the values contained in the first and second shift register locations 404, 405 of the 15 bit shift register. The second XOR gate 402 performs an exclusive OR operation on the output of the first shift register location 404 and the incoming data 406 from data bus 310 during a write operation to output a coded data onto coded data bus 311. The output of second XOR gate 402 is written to the memory array 301. As the output of the first XOR gate 401 is clocked around the shift register the register value is exclusive OR'd with the data on data bus 310. An initialization value of hexadecimal 0029, being a bit sequence 0000 0000 0101 001 is used in the best mode herein. During a read operation, second XOR gate 402 performs an exclusive OR operation on the incoming read encoded data bit stream 408 from the data store 306 to reproduce an output data 409 which is passed onto data bus 310.

An example of operation of the balancing circuit 307 will now be described, in which an incoming data for initialization of the memory array is written to the memory array 301. In this example, the initialization incoming data received on data bus 310 comprises a sequence of '0's. For simplicity, an example of a section of the memory array comprising 8 rows of memory elements, in each row having 16 individual memory elements is taken, such that the section of the memory array comprises an 8 row×32 column array. Whilst FIG. 4 herein shows a bit serial implementation, data balancing can easily be performed on parallel data words, for example 16 bits, in parallel to match the width of the data bus 310 to the memory device 300.

The initialization value of the shift register is 0029 hexadecimal, as illustrated in FIG. 4, although it will be appreciated in principle that there are a wide variety of initialization values of the shift register which may give satisfactory data balancing results, and the value 0029 is only one example. In the present example, the array size is 1024×1024 bits. In the best mode described herein, the hexadecimal value 0029 is selected as it produces an output of 512 '0's and 512 '1's for an input of 1024 bits of all '1's and all '0's. Different initialization values will give different outputs for any given bit input.

The incoming data of '0's is input into second XOR gate 402 to which is applied an exclusive OR operation with the output of the first location 404 of the shift register. A sequence of 64 '0's input from the incoming data bits 310 results in the coded output write bits 1001 0100 0000 0001 0111 1000 0000 0111 0001 0000 0001 0010 0110 0000 0110 1101.

Taking an example of a 1024 element row×1024 element column array, using the shift register initialization sequence 0029 as illustrated in FIG. 4, if a set of 1024 bits, that is to say enough to write a whole row of memory elements is fed into the balancing circuit, then after coding, there are exactly 512 '1's and 512 '0's in the resultant coded bit stream fed to the data store 306. As will be appreciated by those skilled in the art, there are different initialization values which may be applied to the shift register balancing circuit of FIG. 4, and there are also different exclusive OR configurations which may be applied to give different pseudo randomization patterns of coded data. However, using the best mode implementation as shown in FIG. 4 hewn has an advantage of simplicity of implementation, and speed of operation in use.

In FIG. 4. if a same initialization value 0029 was used for each row of 1024 bits input into the shift register to be coded, then although the bits along the row elements would be balanced in terms of '1's and '0's, the cumulative along the columns of elements would not be balanced, since the same coding is applied to successive data in each of the elements along the column. Thus, in the example of initialization of the memory by an input data stream comprising a series of '0's, applying the same initialization value to each row produces either all '1's or all '0's along each column. Therefore, the initialization values are consecutively shifted by one clock per row, i.e. one dock for row one, two clocks for row two, and so on.

Referring to FIG. 5 herein, there is illustrated schematically a sequence of data produced by balancing circuit of FIG. 4 from the initialization sequence 0000 0000 0101 001, when successively shifted by 1 dock per row. The data illustrated in FIG. 5 shows the first 32 bits in the first 8 rows of a memory, where the original unencoded data to be written is all '0's. In FIG. 5, each row has length 1024 bits, and only the first 32 bits are illustrated as can be seen in FIG. 5, the balancing circuit introduces '1's into the data in both the rows and columns, and over an extended length of 1024 bits balances the '1's and '0's avoiding, in this case, extended runs of either '1's or '0's exceeding 14 bits in length.

The spatial layout of bits as illustrated in FIG. 5 reflects the spatial arrangement of bits stored in the two-dimensional memory element array. Along each row and column of memory elements, the number of '0's and '1's is more balanced, as compared with the initial data input of all '0's, and the spacing of '0's and '1's along each row and column of elements is also more balanced out.

It will be appreciated by those skilled in the art that whether the balancing circuit 307 is provided on a storage device chip containing an array of memory elements, or whether a plurality of arrays are served by a separate data balancing circuit provided on a separate chip is an implementation specific detail which may vary from application to application. For example, in a product having a large number of MRAM chips it may be more cost effective and technically efficient to provide the coding and decoding functionality for the plurality of MRAM arrays separate from the individual arrays. On the other hand, in a product having a single MRAM array, it may be necessary to provide the coding/decoding functionality of the balance circuit on a same chip as the MRAM array itself.

What is claimed is:

1. A method of writing incoming data to a data storage device comprising an array of memory elements arranged in rows and columns and accessible by a plurality of data access lines said method comprising the steps of:

receiving said incoming data as a plurality of ones and zeros;

coding said incoming data to produce a coded data, said coded data comprising a plurality of ones and zeros and said coding comprising applying an output of a pseudo random bit sequence generator to said incoming data;

storing said coded data in said array of memory elements, such that a plurality of said ones and zeros comprising said coded data are stored along each row, and a plurality of ones and zeros comprising said coded data are stored along each column, such that:

a substantially similar number of ones and zeros occur along each said row of memory elements; and a substantially similar number of ones and zeros occur along each said column of memory elements.

2. The method as claimed in claim 1, wherein for each said row a distribution of said ones and zeros along said row is such that significant spatial concentrations of ones and significant spatial concentrations of zeros are avoided.

3. The method as claimed in claim 1, wherein for each said column, a distribution of said ones and zeros of said column is such that significant spatial concentrations of ones and significant spatial concentrations of zeros are avoided along said column.

4. The method as claimed in claim 1, wherein said step of coding said incoming data comprises coding said incoming data to produce a pseudo-randomized coded data.

5. The method as claimed in claim 1, wherein said step of applying an output of a pseudo random bit sequence generator to said incoming data comprises exclusive OR ing said data with said output.

6. The method as claimed in claim 1, wherein said pseudo random bit sequence generator is implemented using a shift register and at least one exclusive OR gate.

7. The method as claimed in claim 1, wherein said pseudo random bit sequence generator is initialized with hexadecimal value 0029.

8. The method as claimed in claim 1, wherein said coding step comprises initializing said pseudo random bit sequence generator with initialization values that are consecutively shifted by one dock per row of said array.

9. The method as claimed in claim 1, wherein said step of coding said incoming data comprises:

combining data blocks of said incoming data with a predetermined code value, such that said combination of said incoming data and said coding produces said coded data having a relatively more even distribution of ones and zeros in said coded data than in said incoming data.

10. A method of reading coded data from a data storage device comprising an array of memory elements arranged in a plurality of rows and columns, and accessed by a plurality of data access lines, wherein values of data stored on said memory elements affect electrical characteristics of said data storage device, said coded data comprising a plurality of ones and zeros and said coded data having been produced by applying an output of a pseudo random bit sequence generator to the pre-coded data, said method comprising the steps of:

reading a said coded data from said memory array; and decoding said read coded data to produce a decoded data having a distribution of ones and zeros having a greater disparity between a number of ones and zeros than said coded data read from said two-dimensional array of memory elements.

11. The method as claimed in claim 10, wherein said step of decoding comprises:

combining said coded data with a predetermined value, to obtain said decoded data.

12. The method as claimed in claim 10, wherein said step of decoding comprises:

reading said coded data in blocks corresponding to each of a plurality of said rows of memory elements; and for each block, operating on said coded data with a predetermined value;

wherein said predetermined value is modified for each subsequent data block corresponding to a respective said row of memory elements.

13. A data storage device comprising:

at least one array of memory elements arranged in a plurality of rows and columns, said memory elements accessed by a plurality of data access line;

a coder for coding input data into a form having a balanced proportion of ones and zeros, said coder being arranged for applying an output of a pseudo random bit sequence generator to said incoming data;

said array of memory elements being arranged to be responsive to said coded data such that said ones and zeros are adapted to be spatially distributed across said plurality of memory elements in a manner for substantially balancing a number of said ones and zeros along each of said rows and columns; and a decoder for decoding said coded data read from said plurality of memory elements, into said original data.

14. The data storage device as claimed in claim 13, wherein said coder comprises a shift register and at least one exclusive OR gate.

15. The data storage device as claimed in claim 13, wherein said decoder comprises a shift register and at least one exclusive OR gate.

16. A method of writing incoming data to a magnetic random access data storage device comprising an array of memory elements arranged in rows and columns and accessible by a plurality of data access lines, said method comprising the steps of:

receiving said incoming data as a plurality of ones and zeros;

coding said incoming data to produce a coded data, said coded data comprising a plurality of ones and zeros;

storing said coded data in said array of memory elements, such that a plurality of said ones and zeros comprising said coded data are stored along each row, and a plurality of ones and zeros comprising said coded data are stored along each column, such that:

a substantially similar number of ones and zeros occur along each said row of memory elements; and a substantially similar number of ones and zeros occur along each said column of memory elements.

17. A method of reading coded data from a random access data storage device comprising an array of memory elements arranged in a plurality of rows and columns, and accessed by a plurality of data access lines, wherein values of data stored on said memory elements affect electrical characteristics of said data storage device, said coded data comprising a plurality of ones and zeros, said method comprising the steps of:

reading a said coded data from said memory array; and decoding said read coded data to produce a decoded data having a distribution of ones and zeros having a greater disparity between a number of ones and zeros than said coded data read from said two-dimensional array of memory elements.

18. A random access memory data storage device comprising:

at least one array of memory elements arranged in a plurality of rows and columns, said memory elements being adapted to be accessed by a plurality of data access line;

a coder for coding input data into a form having a balanced proportion of ones and zeros;

said array of memory elements being arranged to be responsive to said coded data such that said ones and zeros are adapted to be spatially distributed across said plurality of memory elements in a manner for substantially balancing a number of said ones and zeros along each of said rows and columns; and a decoder for decoding said coded data read from said plurality of memory elements, into said original data.

* * * * *